(12) United States Patent
Morrison et al.

(10) Patent No.: US 7,564,264 B1
(45) Date of Patent: Jul. 21, 2009

(54) PREVENTING TRANSISTOR DAMAGE

(75) Inventors: Shawn K. Morrison, San Jose, CA (US); James J. Koning, Mountain View, CA (US); Greg W. Starr, San Jose, CA (US); John D. Logue, Placerville, CA (US); Robert M. Ondris, Santa Clara, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/803,530

(22) Filed: May 14, 2007

(51) Int. Cl.
*H03K 19/094* (2006.01)

(52) U.S. Cl. .............................. 326/68; 326/58; 326/80

(58) Field of Classification Search .................. 326/68, 326/80, 83, 86, 87, 56, 58; 327/108, 109, 327/333
See application file for complete search history.

(56) References Cited

U.S. PATENT DOCUMENTS

| | | | | |
|---|---|---|---|---|
| 5,526,325 A | * | 6/1996 | Sullivan et al. ............. 367/138 |
| 5,717,362 A | * | 2/1998 | Maneatis et al. ............. 331/57 |
| 6,696,859 B2 | * | 2/2004 | Yagishita et al. ............. 326/82 |
| 6,943,585 B2 | * | 9/2005 | Lee et al. ....................... 326/58 |
| 7,015,734 B1 | * | 3/2006 | Pettersen ..................... 327/157 |
| 7,072,242 B2 | * | 7/2006 | Okuda et al. ................. 365/154 |

* cited by examiner

*Primary Examiner*—James H. Cho
*Assistant Examiner*—Crystal L Hammond
(74) *Attorney, Agent, or Firm*—W. Eric Webostad

(57) ABSTRACT

Preventing transistor damage to an integrated circuit is described. The circuit includes a switch with a first pair of p-type transistors respectively coupled in source-drain parallel with second pair of p-type transistors for preventing Negative Bias Temperature Instability ("NBTI") damage to the second pair of p-type transistors. The switch is configured to such that when in a state associated with causing, or potentially causing, NBTI damage, both of the second pair of p-type transistors are in an OFF state for preventing NBTI damage thereto.

18 Claims, 5 Drawing Sheets

PREVENTING TRANSISTOR DAMAGE

FIELD OF THE INVENTION

One or more aspects of the invention relate generally to integrated circuits and, more particularly, to preventing transistor damage to an integrated circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Conventionally, a CMOS circuit, and in particular a Differential Cascode Voltage Switching Logic ("DCVSL") circuit, may have pairs of transistors which are to operate with substantially equivalent threshold voltages. However, as transistors become smaller, such transistor pairs are more susceptible to operating conditions changing threshold voltage of a transistor of such pair. This variation may lead to duty cycle distortion.

Accordingly, it would be desirable and useful to provide means for enhancing reliability of transistor pairs to prevent damage to a transistor of a pair of transistors.

SUMMARY OF THE INVENTION

One or more aspects of the invention generally relate to integrated circuits and, more particularly, to preventing transistor damage to an integrated circuit.

An aspect of the invention relates generally to an integrated circuit which includes a switch having first and second output nodes, a power terminal coupled to a supply voltage, and a ground terminal, a first p-type transistor, a second p-type transistor, and a first n-type transistor. The first p-type transistor has a first p-type source node coupled to the power terminal and has a first p-type drain node coupled to the first output node. The second p-type transistor has a second p-type source node coupled to the power terminal and has a second p-type drain node coupled to the second output node. The first n-type transistor has a first n-type drain node coupled to ground terminal and has a first n-type source node coupled to ground potential. Gates of the third p-type transistor, the fourth p-type transistor and the third n-type transistor are commonly coupled to receive a control signal for selectively enabling an inactive mode of the switch. In the inactive mode, the control signal decouples the switch from the ground potential via the first n-type transistor, and applies the supply voltage to the first output node and the second output node via the first p-type transistor and the second p-type transistor, respectively. Application of the supply voltage to the first output node and the second output node prevents Negative Bias Temperature Instability ("NBTI") damage in the switch.

Another aspect of the invention relates generally to a method for preventing damage to a pair of cross-coupled p-type transistors. A first p-type transistor and a second p-type transistor are formed to respectively shunt the pair of cross-coupled p-type transistors. The first p-type transistor is in source/drain parallel with a first one of the pair of cross-coupled p-type transistors. The second p-type transistor is in source/drain parallel with a second one of the pair of cross-coupled p-type transistors. A control voltage is applied to a first gate of the first p-type transistor and a second gate of the second p-type transistor to place each of the pair of cross-coupled p-type transistor in a substantially nonconductive state to prevent Negative Bias Temperature Instability ("NBTI") damage.

Yet another aspect of the invention relates generally to an integrated circuit comprising a plurality of delay lines each including switches coupled in series, and control logic. Each of the switches include a first p-type transistor and a second p-type transistor coupled to respectively shunt a pair of cross-coupled p-type transistors. The first p-type transistor is in source/drain parallel with one of the pair of cross-coupled p-type transistors. The second p-type transistor is in source/drain parallel with another one of the pair of cross-coupled p-type transistors. The first p-type transistor and the second p-type transistor are coupled to receive a control signal. An n-type transistor is coupled to receive the control signal. The control logic is configured to provide a first version of the control signal and a second version of the control signal delayed with respect to one another. A first portion of the plurality of delay lines is coupled to receive the first version of the control signal. A second portion of the plurality of delay lines is coupled to receive the second version of the control signal. The first portion of the plurality of delay lines is coupled to receive a first input for rippling therethrough to provide a first output. The second portion of the plurality of delay lines is coupled to receive the first output as a second input for rippling therethrough to provide a second output.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
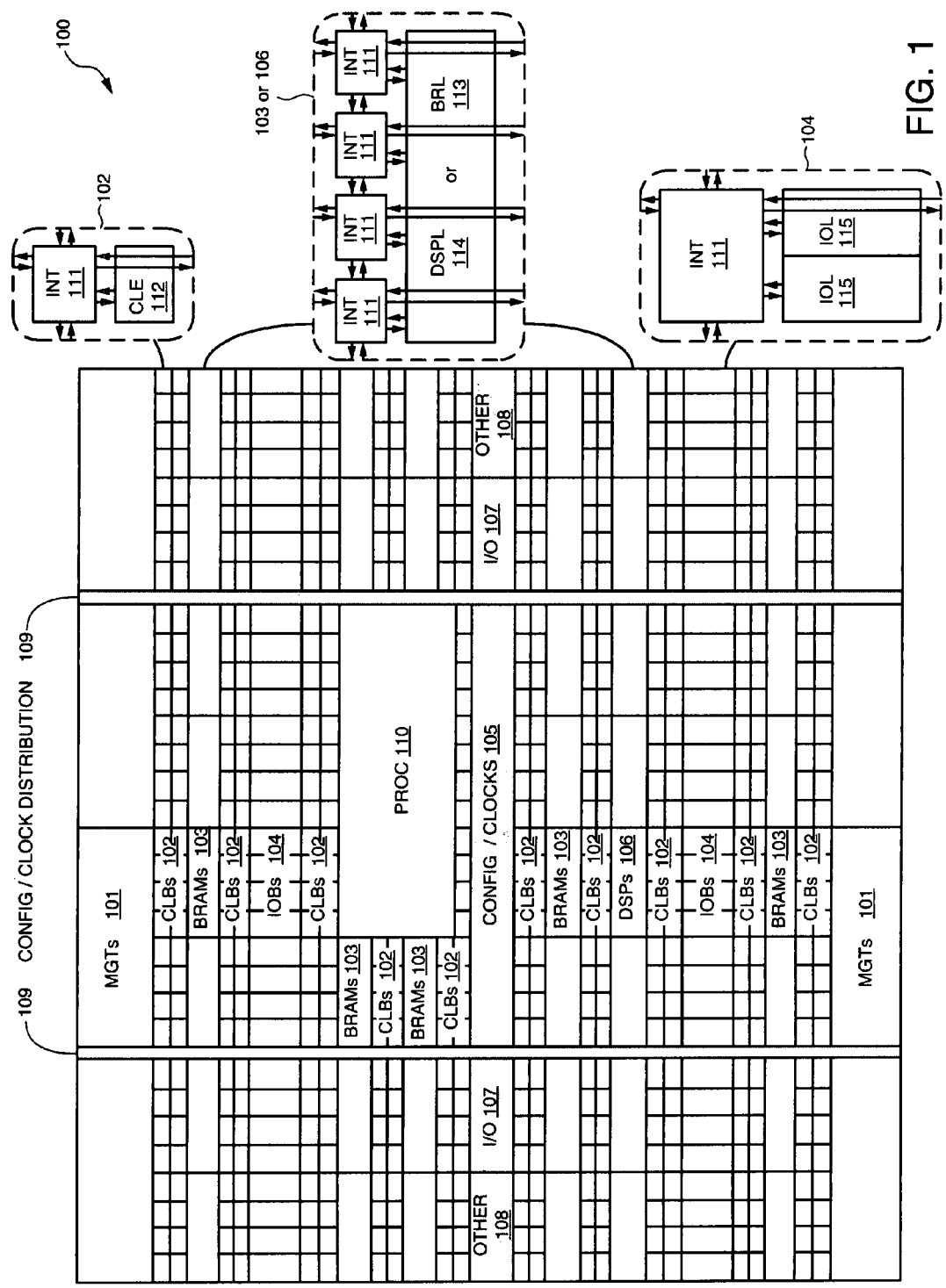
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ or Virtex-5™ FPGA from Xilinx of San Jose, Calif.

Conventionally, a CMOS circuit, and in particular a Differential Cascode Voltage Switching Logic ("DCVSL") circuit, may sustain Negative Bias Temperature Instability ("NBTI") damage due to threshold voltage degradation of a p-type transistor during a standby or other state of inactivity while such circuit was powered. In such an inactive state, one p-type transistor of a pair of cross-coupled p-type transistors would be in an at least substantially non-conductive state, namely an "OFF" state, and the other of such cross-coupled p-type transistors would be in an at least substantially conductive state, namely an "ON" state. Thus, placing such a switch circuit in an inactive state for any substantial period of time, including accumulation of such periods of inactivity, may cause the threshold voltage associated with the p-type transistor more frequently in an ON state to degrade, namely to have a reduced threshold voltage. This degradation is termed NBTI damage, and may lead to an imbalance between threshold voltage switching points of the pair of cross-coupled p-type transistors. Such an imbalance may lead to distortion in output pulses of such a switch, namely duty cycle distortion. While for some applications such distortion on an individual switch may be tolerated, when multiples of such switches are coupled to one another, such as in a delay line, such duty cycle distortion may be significant. Notably, NBTI damage may increase with increasing temperature, and thus application of a control signal 212 described with reference to FIG. 2A may be applied more readily as temperature increases. Moreover, a CMOS circuit, and in particular a DCVSL circuit, may sustain Positive Bias Temperature Instability ("PBTI") damage due to threshold voltage degradation of an n-type transistor during a standby or other state of inactivity while such circuit was powered. For purposes of clarity by way of example, NBTI is described below in additional detail. However, it will be appreciated by those of ordinary skill in the art that the following description equally applies to PBTI, where p-type and n-type transistors may be exchanged for one another.

Figure 2A:
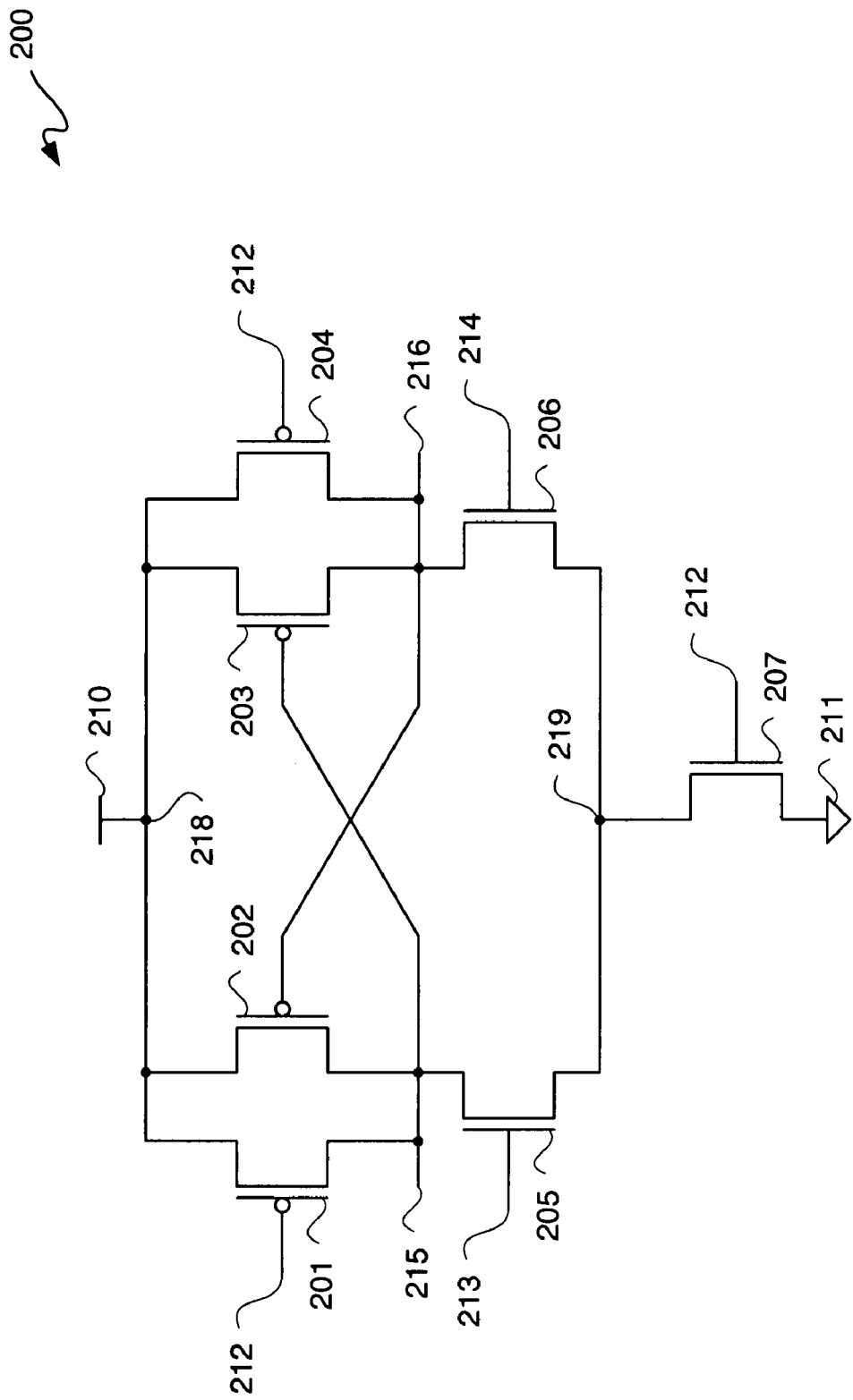
FIG. 2A is a circuit diagram depicting an exemplary embodiment of a Differential Cascode Voltage Switching Logic ("DCVSL") switch.

FIG. 2A is a circuit diagram depicting an exemplary embodiment of a DCVSL switch 200. However, alternatively, switch 200 may be thought of as a differential driver circuit.

Prior to the addition of NBTI damage-preventing transistors 201, 204, and 207, switch 200 included cross-coupled p-type transistors 202 and 203, and input n-type transistors 205 and 206, which heretofore had their source nodes directly coupled to ground instead of the coupling to ground 211 via added n-type transistor 207. Notably, with reference to NBTI damage, use of the terms "prevented," "prevent" and "preventing" herein is meant to convey full or partial prevention of such NBTI damage with respect to a single occurrence of use of an integrated circuit or use of an integrated circuit over time, or any combination thereof.

In an active state, n-type transistor 207 receives control signal 212 at a logic high level sufficient for putting transistor 207 in an ON state. In an ON state, common node 219 is coupled to ground 211. Input 213 to n-type transistor 205, for example, may be a logic high input or a logic low input, and input 214 to n-type transistor 206 is the inverse of input 213. Thus, for example, for input 213 at a logic high level, input 214 will be at a logic low level.

In an active state, for input 213 at a logic high level, n-type transistor 205 is in an ON state, and thus output node 215 is coupled to ground 211. Additionally, for output node 215 coupled to ground 211, p-type transistor 203 is in an ON state.

For input 214 at a logic low voltage level, n-type transistor 206 is placed in an OFF state, and thus having p-type transistor 203 in an ON state allows supply voltage 210 coupled at common node 218 to be applied to output node 216.

For supply voltage 210, which is at a logic high voltage level, applied to output node 216, p-type transistor 202 is placed in an OFF state. Furthermore, in an active mode, as control signal 212 is at a logic high level, application of voltage of such signal to gates of p-type transistors 201 and 204 places such transistors in an OFF state. Accordingly, gates of transistors 201, 204, and 207 may be coupled to a common node (not shown) for receiving control signal 212.

In an inactive state, control signal 212 is at a logic low voltage level. Coupling p-type transistors 201 and 204 in source drain parallel with p-type transistors 202 and 203, respectively, allows application of control signal 212 in an inactive state to effectively shunt p-type transistors 202 and 203, as described below in additional detail.

For p-type transistors 201 and 204 to respectively shunt p-type transistors 202 and 203, turn-on strength of p-type transistors 201 and 204 may be substantially weaker than the turn-on strength of p-type transistors 202 and 203. The relative strength, for example, of p-type transistor 202 to p-type transistor 201 may be a minimum of approximately four-to-one ("4:1"). Notably, the channel length and channel width of p-type transistors 201 and 204 may be sized to achieve a target turn-on strength ratio. However, it should be appreciated that p-type transistors 201 and 204 need not have a weaker turn-on strength than that of p-type transistors 202 and 203, and turn-on strength of transistors 201 through 204 may be at least approximately equivalent to one another.

It should be understood that for "weak" p-type transistors 201 and 204, current ramps more slowly than for p-type transistors 202 and 203. This may effectively spread out power draw during a power-down cycle over a longer period of time, namely avoiding or at least reducing a power surge or spike during powering down. Notably, during a power-up cycle, control signal 212 is at a logic high level, and thus p-type transistors 201 and 204 are in an OFF state. In such an OFF state, p-type transistors 201 and 204 do not have an effect during a power-up cycle.

Furthermore, it should be appreciated that by using relatively weak p-type transistors 201 and 204, instantaneous or peak current draw when going to a standby mode may be lessened, spread out over a larger time period, in comparison to using higher-drive p-type transistors. Notably, once in a standby mode, there is little to no appreciable current draw. As shall become more apparent from the following example, having a static logic 0 voltage applied to either of p-type transistors 202 and 203 in a standby state, is avoided, as a static logic 1, namely a logic high level, is applied to both p-type transistors 202 and 203 in a standby state to prevent NBTI damage. As shall be appreciated, by preventing NBTI damage, distortion caused by differences in threshold voltage of p-type transistors 202 and 203 may be prevented, which facilitates preventing distortion in duty cycle caused by NBTI effects. More particularly, by maintaining more closely matched threshold voltages of p-type transistors 202 and 203, faster operation of switch 200 may be obtained.

Accordingly, for an inactive or standby state, control signal 212 is applied as a logic low voltage, which causes transistor 207 to be in an OFF state. When transistor 207 is in an OFF state, common node 219 is electrically decoupled from ground 211. Accordingly, transistors 205 and 206 are electrically decoupled from ground 211, meaning output nodes 215 and 216 are allowed to float independently of inputs 213 and 214. Notably, by allowing output nodes 215 and 216 to float, feedback problems may be avoided or reduced with respect to stringing switches 200 together in the form of a delay line, and output nodes 215 and 216 may be pulled up to supply voltage level 210 via p-type transistors 201 and 204 for control signal 212 in a logic low state.

For control signal 212 in a logic low state, p-type transistors 201 and 204 are placed in an ON state, allowing each of them to respectively couple supply voltage 210 to output nodes 215 and 216. By having output nodes 215 and 216 at a logic high voltage level of supply voltage 210, each of the gates of p-type transistors 202 and 203 receives a logic high voltage level. In other words, both of p-type transistors 202 and 203 in an inactive state or during a power-down cycle receive a static logic 1, namely both of those transistors are in an OFF state.

Figure 2B:
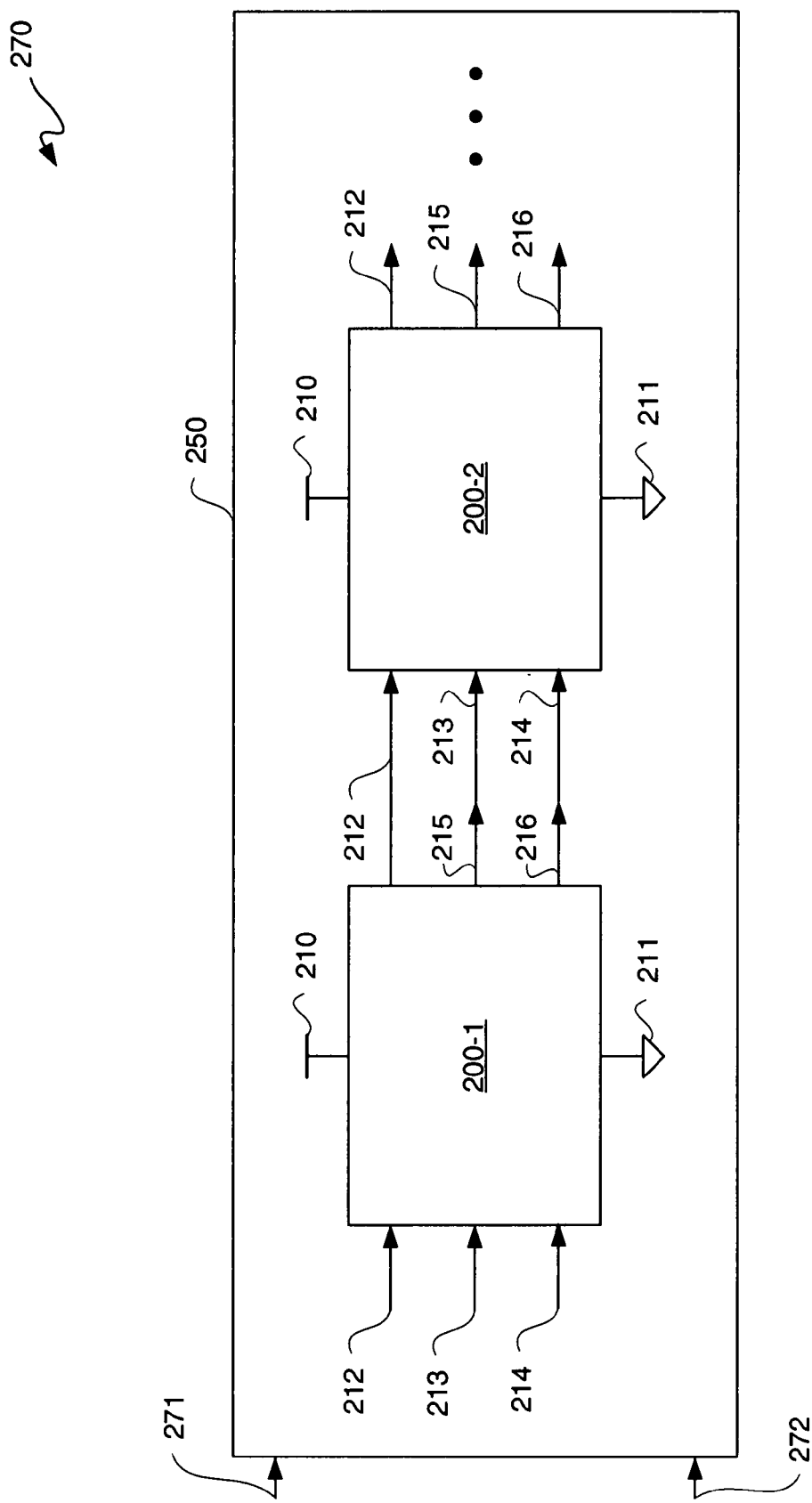
FIG. 2B is a block diagram depicting an exemplary embodiment of a delay-locked loop ("DLL") having a delay line implemented by coupling switches, such as the switch of FIG. 2A, in input-to-output series.

It should be appreciated that switches 200 may be coupled input-to-output in series to form a delay line. FIG. 2B is a block diagram depicting an exemplary embodiment of a delay-locked loop ("DLL") 270 having a delay line 250 implemented by coupling switches, such as switch 200 of FIG. 2A, in input-to-output series. DLL 270 may be of a Clock Management Tile ("CMT"), or more particularly a Digital Clock Manager ("DCM") block in a CMT of an FPGA, such as of config/clocks 105 of FPGA 100 of FIG. 1.

More particularly, switch 200-1 receives inputs 213 and 214 and provides outputs 215 and 216. Outputs 215 and 216 of switch 200-1 respectively may be provided as inputs 213 and 214 of switch 200-2. Notably, output 215 of switch 200-1 need not be provided as input 213 to switch 200-2, but may be provided as input 214 to switch 200-2. Likewise, output 216 of switch 200-1 need not be provided as input 214 to switch 200-2, but may be provided as input 213 to switch 200-2.

Control signal 212 may be provided to each switch in a series of switches, forming delay line 250, such as switches 200-1 and 200-2. Even though control signal 212 is illustratively shown as passing through each of switches 200-1 and 200-2, such control signal may be commonly bused to each of a plurality of such switches.

Notably, inactive states may be caused by any of a variety of conditions. For example, if DLL 270 has either of its input clocks, namely a free-running input clock 271 or a feedback input clock 272, stopped, then an inactive state of switch 200 may be triggered. Furthermore, if an internal oscillator clock of a Digital Frequency Synthesizer ("DFS") (shown as an option in FIG. 4) were to stop, this may trigger an inactive condition.

Some systems momentarily pause a DCM's input clock for various reasons. For example, some systems, during configuration or reconfiguration of an FPGA, disable the input clock to the DCM during such configuration or reconfiguration. Furthermore, some FPGA-implemented systems have the FPGA powered up, but not yet configured. Accordingly, an FPGA in such a state may not have an input clock provided to a DCM thereof. As a delay line, such as delay line 250, may be used in a DLL of such a DCM, damaging effects of NBTI may be prevented by timely application of control signal 212. Moreover, with respect to a power-down cycle, power down detection may be under direct control of a user, and as such data signal ("data") 310 of FIG. 3 may be used.

Figure 3:
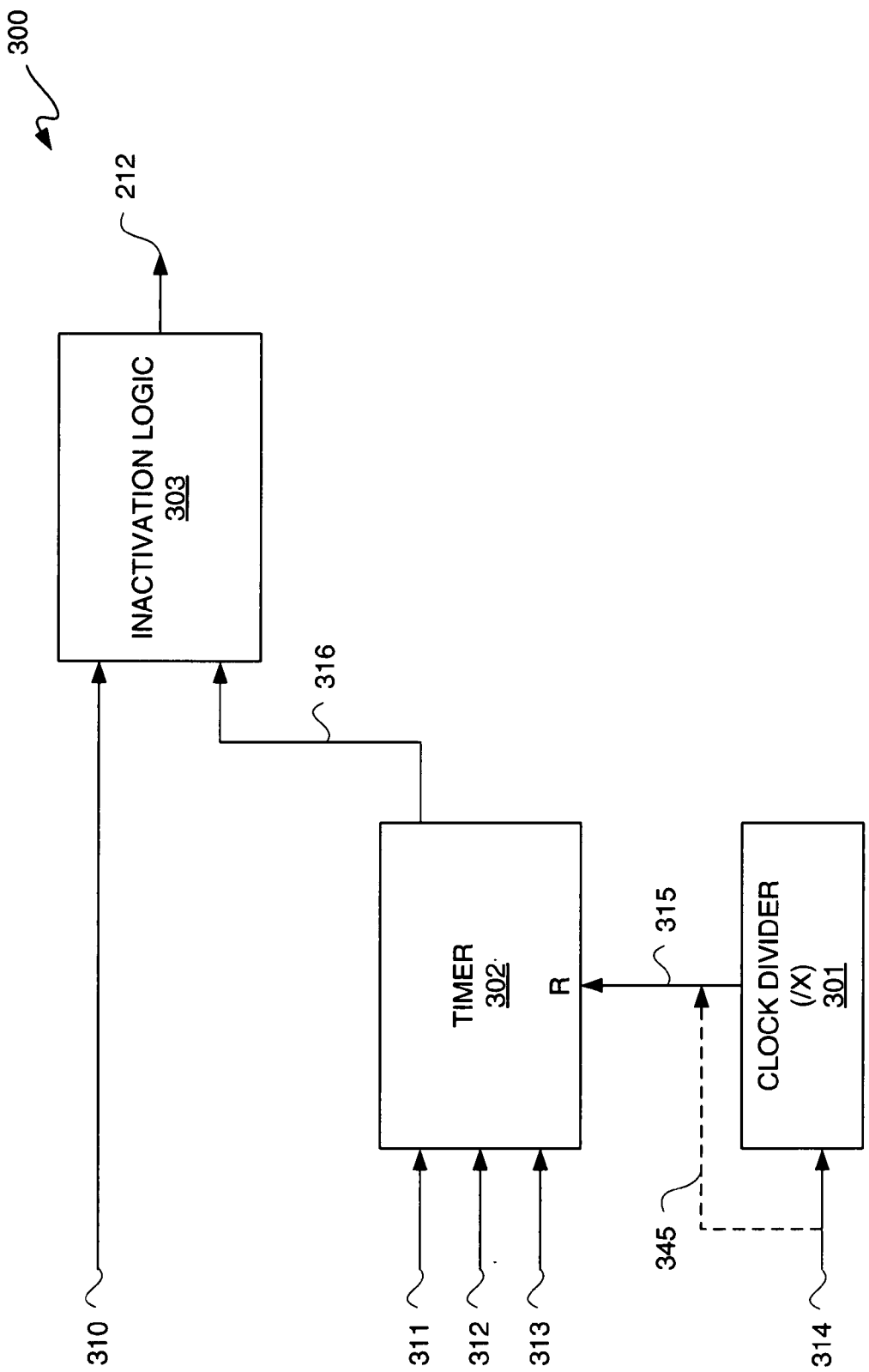
FIG. 3 is a block diagram depicting an exemplary embodiment of a control signal generator.

FIG. 3 is a block diagram depicting an exemplary embodiment of control signal generator 300. Control signal generator 300 includes inactivation logic 303, timer 302, and an optional clock divider 301. As indicated above, if a clock is stopped or otherwise disabled, control signal 212 may be applied in a timely manner to prevent NBTI damage. Notably, there may be other instances, namely other than a clock stoppage for example, that may cause or promote NBTI damage. Accordingly, data 310, which may be used to indicate such other conditions. Thus, data indicating such a condition may be provided via data 310 to inactivation logic 303 for generating control signal 212. For purposes of clarity by way of example and not limitation, an example of how control signal 212 may be generated responsive to an input clock signal ("input clock") 314 being stopped for a sufficient period of time is described. For purposes of clarity by way of example and not limitation, it shall be assumed that clock divider 301 is included even though it may be omitted as input clock 314 may be directly input to a reset port of time 302 as generally indicated by dashed line 345.

With renewed reference to FIGS. 2A and 2B and continuing reference to FIG. 3, control signal generator 300 is further described. Input clock 314 is provided to clock divider 301. Clock divider 301 divides input clock 314 by some value X to provide a lower frequency clock signal, namely divided clock signal ("divided clock") 315. The value of X may vary from application-to-application, and may be user programmable. Divided clock 315 output from clock divider 301 is provided to a reset port of timer 302. Additionally provided to timer 302 are enable signal 311, length of time out input signal 312, and clock signal 313. Clock signal 313 may be what is known as a "free-running" clock signal; however, other known types of oscillating signals may be used. Clock signal 313 may be external to a clock management tile ("CMT") of an FPGA, such as FPGA 100 of FIG. 1, and thus for clarity clock signal 313 is referred to as external clock 313. External clock 313 may be generated internal to FPGA 100, or may be provided off-chip for input to FPGA 100. For purposes of clarity, it shall be assumed that external clock 313 is generated internal to FPGA 100.

Input clock 314, for purposes of clarity by way of example and not limitation, is described as a "user-provided" clock signal. Input clock 314 may be generated on-chip or obtained from an off-chip source with reference to an FPGA 100. For purposes of clarity by way of example and not limitation, it shall be assumed that input clock 314 may be provided to all DCMs, or more generally CMTs of an FPGA.

Furthermore, it should be appreciated that timer 302 may be a programmable timer, such that a user may program the time interval to wait prior to asserting control signal 212 to cause a delay line, such as delay line 250, or an individual switch, such as switch 200, or a combination thereof, to be put in an inactive state.

While not wishing to be bound by theory, it is believed that for p-type transistors formed using minimum dimensions of a 65 nanometer ("nm") semiconductor process, durations in excess of approximately one microsecond may cause measurable NBTI damage when a delay line, such as delay line 250, or an individual switch, such as switch 200, is in a standby or inactive state, but for the timely assertion of control signal 212. Thus, as a general rule for transistors formed with minimum dimensions using a 65 nm semiconductor process, timer 302 may be programmed to assert a timed out signal 316 responsive to an interval of time greater than approximately one microsecond. Notably, a minimum dimension using a 65 nm semiconductor process may approach 32.5 nm. Furthermore, it should be appreciated that p-type transistors may become more susceptible to NBTI with subsequent semiconductor process shrinks, and thus in subsequent generations of p-type transistors this time interval may be shortened.

Again, it should be appreciated that clock stoppage may occur during certain designed intervals of time. Thus, waiting some amount of time prior to assertion of control signal 212 may be desirable to avoid shutting down delay line 250. Notably, if delay line 250 is shut down responsive to assertion of control signal 212, a DCM in which delay line 250 is implemented may go into a reset mode, and a user may want to avoid such complication or delay in instances of designed clock stoppage time.

In operation, enable signal 311 is active; however, a user may choose to disable use of application of control signal 212 by disabling enable signal 311. Thus, for example, a user may more directly control assertion of control signal 212 responsive to data 310.

However, for purposes of clarity by way of example, assume timer 302 is programmed with a length of time out responsive to length of time out input signal 312. Timer 302 receives an external clock 313.

Clock divider 301 may continually reset programmable timer 302, which may be implemented as a count-down counter, responsive to continual running of input clock 314. If, however, input clock 314 stops, then programmable timer 302 is not reset responsive to divided clock 315. If input clock 314 stops running for a sufficient length of time such that the length of time out is exceeded and programmable timer 302 times out such as when counter counts down to 0, then timed out signal 316 is asserted as provided to inactivation logic 303 for asserting control signal 212. By asserting a signal, it is generally meant that such signal changes state to invoke a different operating condition.

Control signal 212 would then be asserted, namely provided as a logic low output to delay line 250 or to an individual switch 200, or a combination thereof. Notably, by placing delay line 250 or an individual switch 200, or a combination thereof, in an inactive state by the assertion of control signal 212, NBTI effects may be prevented.

Although the example of approximately one microsecond has been described with reference to approximately when NBTI damage may occur, it should be appreciated that NBTI damage may be characterized on an individual basis. For example, a DCM may be placed into a running state, and then the input clock or clocks to the DCM may be stopped for some period of time. Notably, this assumes we have not implemented or activated a clock stoppage detector, such as control signal generator 300. After each period of time, performance of the DCM, namely duty cycle distortion, if any, may be measured or otherwise characterized. This may be done for example until a threshold voltage of p-type transistors has reached a state of NBTI damage which is not tolerable. Furthermore, it should be appreciated that NBTI damage is cumulative.

For a DFS, one or more delay lines are coupled in series in a closed loop. For such a DFS, an additional condition of an oscillator clock stopping may be handled by reapplication of the time out of DFS control logic instead of use of programmable timer 302 to conserve circuit resources. Notably, DFS control logic generates and uses a different clock than the remainder of the DFS circuit. To coordinate an asynchronous interface of a DFS, DFS control logic may make a request to DFS delay modules and send a reply back. If an error occurs, and the DFS delay modules do not reply back, the DFS control logic, rather than waiting, may have a time out asserted. This time out may be created by starting a counter when the request is made and resetting once a reply is received by the DFS control logic. If a certain count is reached before getting a reset, an error flag may be asserted as the reply has timed out. Notably, responsive to the reply timing out, a dummy reply may be sent such that the DFS control logic may continue to run.

After an oscillator has started, the DFS control logic may continually make requests to DFS delay modules to update tap and trim values to stay frequency locked. These requests may be synchronized to the oscillator clock and DFS delay modules. Once a request is completed, a reply may be sent. This portion of the DFS delay modules may run off the oscillator clock, so if the oscillator clock is not running, the reply will not be sent. The reply may time out, and this time out may used to indicate a stopped oscillator clock.

Accordingly, it should be appreciated that there are numerous applications for use of delay lines, including the example of a DFS. Moreover, there are numerous ways of determining whether a clock signal, including an oscillator signal, has stopped for a sufficient period of time.

A power-up condition for an FPGA is configurable through configuration memory cells. The power-up condition may be the assertion of a DCM's reset input. This option may be used for systems that implement the DCM such that it stays in a reset state if its clock stops. Notably, the DCM may stay in a reset state if its clock stops for purposes of characterization or test purposes. The power-up condition may be the start up of one or more of the DCM input clocks after timer 302 has expired. This option may be used in systems where the overhead of managing the reset of the DCM is not desired.

Figure 4:
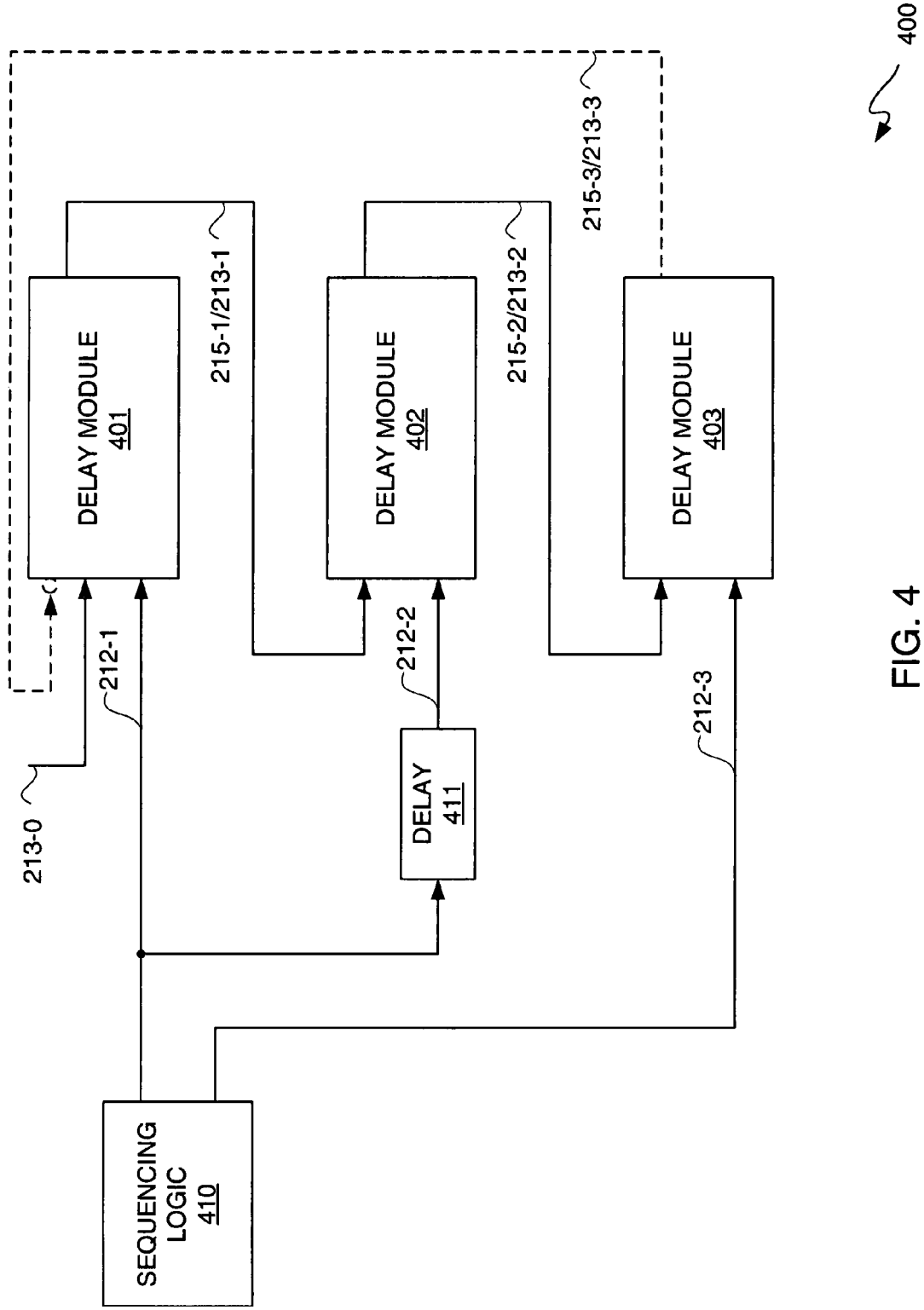
FIG. 4 is a block diagram depicting an exemplary embodiment of a sequencer for power-up of an integrated circuit having multiple DLLs, such as for powering up an FPGA.

FIG. 4 is a block diagram depicting an exemplary embodiment of a sequencer 400 for power-up of an integrated circuit having multiple delay lines, such as for powering up an FPGA. Sequencer 400 includes a plurality of delay modules, where each delay module includes at least one series of switches 200 of FIG. 2A. Such series of switches for purposes of clarity by way of example and not limitation are assumed to be for a delay line, such as delay line 250 of FIG. 2B. Thus, it should be appreciated that each such delay line includes pairs of shunting transistors, such as p-type transistors, for preventing NBTI damage. Moreover, each delay module 401 through 403 may include a grouping of delay lines 250 of FIG. 2B, which absent sequencing would be powered up at relatively the same time. Notably, even though the example of delay lines is used, it should be appreciated NBTI modules 401 though 403 may be for DLLs, and thus sequencing logic 410 may be for sequencing across DLLs.

In this example embodiment, there are three delay modules 401 through 403; however, fewer or more than three delay modules may be implemented. Sequencer 400 further includes sequencing logic 410 and fixed delay 411. Notably, for use of fixed delays, more than one fixed delay may be used to provide progressively delayed control signals 212-N, for N a positive integer greater than one, depending on the number of delay modules coupled in series. Furthermore, rather than a fixed delay 411, sequencing logic 410 may sequentially provide control signals 212-1 through 212-3 with a delay therebetween; however, for purposes of a limited circuit footprint, a fixed delay 411 may optionally be used. Control signals 212-1 through 212-3 may be sequenced versions of control signal 212 of FIG. 2A for a power-up cycle. Sequencing logic 410 may be configured to provide control signal 212-1 to delay module 401 and to delay 411.

With renewed reference to FIGS. 2A and 2B and continued reference to FIG. 4, sequencer 400 is further described. It should be appreciated that switching for example a power-up signal of a delay module 401 may cause a momentary low resistance path between positive and negative supply voltage levels. Notably, in the example of FIG. 2A, power-up, or for that matter power-down, signaling is provided via control signal 212 to a gate of n-type transistor 207. Thus, in this exemplary embodiment, powering up is by electrically coupling switches 200 of a delay line 250 of FIG. 2B to ground 211, and powering down is by electrically decoupling switches 200 of a delay line 250 from ground. Accordingly, in this configuration, for a power-up cycle p-type transistors 201 and 204 are in an OFF state, and thus they are not used for avoiding a power surge or spike during a power-up cycle. In this exemplary embodiment, coupling to and decoupling from ground 211 for power up and down, respectively, are used. However, in an alternative embodiment, coupling to and decoupling from supply voltage 210 may be used for power up and down, respectively.

However, for the configuration using n-type transistor 207 to power up switch 200 by coupling to ground, it should be appreciated that during a power-up cycle there may a momentary low resistance path from supply voltage 210 to ground 211 during switching of n-type transistor 207 from an OFF state to an ON state. This momentary low resistance path may cause one or more significant current spikes when switches 200 of a delay line 250 are all powered up at relatively the same time. Accordingly, sequencer 400 may be used to limit the number of switches 200 being powered up at relatively the same time for multiple DLLs to reduce the previously mentioned current spike or spikes.

Thus, control signal 212-1 powers up switches 200 of delay module 401. An initial input 213-0 may be provided to a first switch of a first delay line of delay module 401, which input ripples through such delay line, or more generally through delay module 401. Output 215-1 of delay module 401 may be provided as an input 213-1 to delay module 402, which input then ripples through delay module 402. Delay 411 may be sufficiently long to preclude control signal 212-2 arriving at delay module 402 prior to input 213-1. Accordingly, delay module 402, which is powered up responsive to control signal 212-2, is powered up after powering up delay module 401. An output 215-2 of delay module 402 may be provided as an input 213-2 to delay module 403, which input then ripples through delay module 403.

Sequencing logic 410 may include a state machine or may be a configurable sequencer for delaying assertion of control signal 212-3 until after input 213-2 is received by delay module 403. Alternatively, if delay modules 401 and 403 for example are sufficiently decoupled from one another with respect to generating a current spike or spikes during a power-up cycle, then both control signals 212-1 and 212-3 may be asserted at relatively the same time although this will increase the instantaneous power draw. Optionally, an output 215-3 of delay module 403 may be provided as a feedback input 213-3 to delay module 401 to take precedence over input 213 provided thereto via control logic (not shown), which input then ripples through delay module 403. For this option, delay modules 401 through 403 may be coupled in series in a closed loop for forming a DFS. Notably, a DFS may not be started at the beginning of a delay line of a DLL, but may actually be started somewhere between the beginning and ending taps of a delay line.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Along those lines, it should be appreciated that NBTI and PBTI are equivalents of one another. Thus, even though the claims are cast in terms of transistors used to prevent NBTI, the opposite type of such claimed transistors are equivalents with respect to preventing PBTI. Claim(s) listing steps do not imply any order of the steps. Trademarks are the property of their respective owners.

What is claimed is:

1. An integrated circuit, comprising:
   a switch having first and second output nodes, a power terminal coupled to a supply voltage, and a ground terminal;
   the switch having:
      a first p-type transistor having a first p-type source node coupled to the power terminal and having a first p-type drain node coupled to the first output node;
      a second p-type transistor having a second p-type source node coupled to the power terminal and having a second p-type drain node coupled to the second output node;
      a first n-type transistor having a first n-type drain node coupled to the ground terminal and having a first n-type source node coupled to ground potential;
      a third p-type transistor having a third p-type source node coupled to the power terminal, a third p-type drain node coupled to the first output node, and a fourth gate node coupled to the second output node; and
      a fourth p-type transistor having a fourth p-type source node coupled to the power terminal, a fourth p-type drain node coupled to the second output node, and a fifth gate node coupled to the first output node;
   a first gate of the first p-type transistor, a second gate of the second p-type transistor, and a third gate of the first n-type transistor being commonly coupled to receive a control signal for selectively activating an inactive mode and an active mode of the switch;
   wherein in the inactive mode, the control signal:
      decouples the switch from the ground potential via the first n-type transistor; and
      applies the supply voltage to the first output node and the second output node via the first p-type transistor and the second p-type transistor, respectively;
   wherein application of the supply voltage to the first output node and the second output node prevents Negative Bias Temperature Instability ("NBTI") damage in the switch;
   a delay line including a plurality of switches coupled in series, the plurality of switches including the switch;
   the third p-type transistor and the fourth p-type transistor each being at least four times stronger with respect to a power-down cycle than the first p-type transistor and the second p-type transistor, respectively, for respective shunting of the first p-type transistor and the second p-type transistor to allow spreading out of power draw during the power-down cycle and to lessen peak current draw when transitioning to the inactive mode.

2. The integrated circuit according to claim 1, wherein the switch is implemented using CMOS logic.

3. The integrated circuit according to claim 1, wherein the switch is implemented using Differential Cascode Voltage Switching Logic ("DCVSL").

4. The integrated circuit according to claim 1, further comprising a delay-locked loop;
   wherein the delay-locked loop includes the delay line.

5. The integrated circuit according to claim 1, further comprising a digital frequency synthesizer;
   wherein the digital frequency synthesizer includes the delay line.

6. The integrated circuit according to claim 1, wherein the integrated circuit is a Field Programmable Gate Array.

7. The integrated circuit according to claim 1, wherein the switch comprises:
   a second n-type transistor having a second n-type source node coupled to the ground terminal, a second n-type drain node coupled to the first output node, and a sixth gate node coupled to receive a first input; and
   a third n-type transistor having a third n-type source node coupled to the ground terminal, a third n-type drain node coupled to the second output node, and a seventh gate node coupled to receive a second input, the second input being an inverted version of the first input.

8. A method for preventing damage to a pair of cross-coupled p-type transistors, comprising:
   providing a plurality of delay lines, each delay line including switches coupled in series, the switches respectively having the pair of cross-coupled p-type transistors;
   for each of the switches:
   forming a first p-type transistor and a second p-type transistor to respectively shunt the pair of cross-coupled p-type transistors,
   wherein:
      the first p-type transistor is in source/drain parallel with a first one of the pair of cross-coupled p-type transistors; and
      the second p-type transistor is in source/drain parallel with a second one of the pair of cross-coupled p-type transistors; and
   applying a first version of the control voltage to a first gate of the first p-type transistor and a second gate of the second p-type transistor of the switches of a first portion of the plurality of delay lines to place each of the pair of cross-coupled p-type transistors thereof in a substantially nonconductive state to prevent Negative Bias Temperature Instability ("NBTI") damage in the switches of the first portion; and
   applying a second version of the control voltage to a first gate of the first p-type transistor and a second gate of the second p-type transistor of the switches of a second portion of the plurality of delay lines to place each of the pair of cross-coupled p-type transistors thereof in the substantially nonconductive state to prevent NBTI damage in the switches of the second portion.

9. The method according to claim 8, further comprising determining a duration that a clock signal is stopped,
   wherein the applying of the control voltage is responsive to the determined duration.

10. The method according to claim 8, wherein the applying of the control voltage is responsive to maintaining a first one of the pair of cross-coupled p-type transistors in the substantially nonconductive state and a second one of the pair of cross-coupled p-type transistors in a substantially conductive state for a duration of at least approximately one microsecond.

11. The method according to claim 8, wherein the applying of the control voltage is responsive to a condition selected from a group consisting of an inactive state, a standby state, and a powering down state, a configuring state of a programmable logic device, and a reconfiguring state of the programmable logic device.

12. An integrated circuit comprising:
   a plurality of delay lines, each delay line comprising switches coupled in series;
   each of the switches including:
      a first p-type transistor and a second p-type transistor coupled to respectively shunt a pair of cross-coupled p-type transistors;
      the first p-type transistor being in source/drain parallel with a first one of the pair of cross-coupled p-type transistors;
      the second p-type transistor being in source/drain parallel with a second one of the pair of cross-coupled p-type transistors;
      the first p-type transistor and the second p-type transistor coupled to receive a control signal; and
      an n-type transistor coupled to receive the control signal; and
   control logic configured to provide a first version of the control signal and a second version of the control signal delayed with respect to one another;
   a first portion of the plurality of delay lines coupled to receive the first version of the control signal;
   a second portion of the plurality of delay lines coupled to receive the second version of the control signal;
   the first portion of the plurality of delay lines coupled to receive a first input for rippling therethrough to provide a first output; and
   the second portion of the plurality of delay lines coupled to receive the first output as a second input for rippling therethrough to provide a second output;
   wherein the control logic is coupled to apply the first version of the control signal to a first gate of the first p-type transistor and a second gate of the second p-type transistor of the switches of the first portion of the plurality of delay lines to place each of the pair of cross-coupled p-type transistors thereof in a substantially nonconductive state to prevent Negative Bias Temperature Instability ("NBTI") damage in the switches of the first portion; and
   wherein the control logic is coupled to apply the second version of the control signal to a first gate of the first p-type transistor and a second gate of the second p-type transistor of the switches of the second portion of the plurality of delay lines to place each of the pair of cross-coupled p-type transistors thereof in the substantially nonconductive state to prevent NBTI damage in the switches of the second portion.

13. The integrated circuit according to claim 12, wherein the second version of the control signal is delayed until after the first output is provided as the second input.

14. The integrated circuit according to claim 13, wherein the switches are Differential Cascode Voltage Switching Logic ("DCVSL") differential drivers.

15. The integrated circuit according to claim 12, wherein the second output is provided from the second portion of the plurality of delay lines to the first portion of the plurality of delay lines to replace the first input.

16. The integrated circuit according to claim 12, wherein the control logic includes a sequencer.

17. The integrated circuit according to claim 12, wherein the control logic includes a fixed delay.

18. The integrated circuit according to claim 12, wherein the control logic includes a timer and a clock divider.

* * * * *